(12) United States Patent
Joo

(10) Patent No.: US 10,777,237 B2
(45) Date of Patent: *Sep. 15, 2020

(54) SEMICONDUCTOR MEMORY DEVICE AND METHOD OF OPERATING THE SAME

(71) Applicant: SK hynix Inc., Icheon-si, Gyeonggi-do (KR)

(72) Inventor: Byoung In Joo, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/503,989

(22) Filed: Jul. 5, 2019

(65) Prior Publication Data

US 2019/0325922 A1    Oct. 24, 2019

Related U.S. Application Data

(63) Continuation of application No. 15/214,631, filed on Jul. 20, 2016, now Pat. No. 10,388,332.

(30) Foreign Application Priority Data

Jan. 28, 2016 (KR) ......................... 10-2016-0010906

(51) Int. Cl.
*G11C 7/04* (2006.01)
*G11C 16/14* (2006.01)
(Continued)

(52) U.S. Cl.
CPC ............... *G11C 7/04* (2013.01); *G11C 16/08* (2013.01); *G11C 16/10* (2013.01); *G11C 16/14* (2013.01); *G11C 16/32* (2013.01); *G11C 16/0483* (2013.01)

(58) Field of Classification Search
CPC ....... G11C 7/04; G11C 16/0483; G11C 16/08; G11C 16/10; G11C 16/14; G11C 16/32
See application file for complete search history.

(56) References Cited

U.S. PATENT DOCUMENTS 8,300,484 B2 * 10/2012 Yoshida ................. G11C 7/04
                                                              365/194
8,437,171 B1 * 5/2013 Gilbert ..................... G11C 7/04
                                                              365/148

(Continued)

FOREIGN PATENT DOCUMENTS

KR    1020030055749 A    7/2003
KR    1020110001580 A    1/2011

(Continued)

OTHER PUBLICATIONS

JEDEC Standard, Double Data Rate (DDR) SDRAM Specification, Revision JESD79B, Mar. 2003, pp. 1-75, JEDEC. (Year: 2003).

*Primary Examiner* — Harry W Byrne
*Assistant Examiner* — R Lance Reidlinger
(74) *Attorney, Agent, or Firm* — William Park & Associates Ltd.

(57) ABSTRACT

There may be provided an electronic device, and more particularly, a semiconductor memory device and a method of operating the same. The semiconductor memory device may include a memory cell array including a plurality of memory cells. The semiconductor memory device may include an operation control signal generator configured to receive a request for performing a target operation from the controller configured to control the semiconductor memory device and to generate a synchronizing signal for performing the target operation. The semiconductor memory device may include a temperature detect circuit configured to detect temperatures of the plurality of memory cells in response to the synchronizing signal.

18 Claims, 10 Drawing Sheets

(51) Int. Cl.
*G11C 16/10* (2006.01)
*G11C 16/08* (2006.01)
*G11C 16/32* (2006.01)
*G11C 16/04* (2006.01)

(56) References Cited

U.S. PATENT DOCUMENTS

| | | | | |
|---|---|---|---|---|
| 8,478,929 | B2* | 7/2013 | Aoki | G11C 16/22 |
| | | | | 711/103 |
| 2006/0023546 | A1 | 2/2006 | Park | |
| 2012/0033503 | A1* | 2/2012 | Kim | G11C 16/16 |
| | | | | 365/185.33 |
| 2014/0204694 | A1 | 7/2014 | Choy | |
| 2015/0206569 | A1* | 7/2015 | Bose | A61G 5/1075 |
| | | | | 365/158 |
| 2016/0172046 | A1 | 6/2016 | Moon et al. | |

FOREIGN PATENT DOCUMENTS

| KR | 1020120086036 A | 8/2012 |
|---|---|---|
| KR | 1020120125791 A | 11/2012 |

* cited by examiner

SEMICONDUCTOR MEMORY DEVICE AND METHOD OF OPERATING THE SAME

CROSS-REFERENCE TO RELATED APPLICATION

The present application is a continuation application of U.S. application Ser. No. 15/214,631, filed on Jul. 20, 2016, and claims priority under 35 U.S.C. § 119(a) to Korean patent application number 10-2016-0010906 filed on Jan. 28, 2016 in the Korean Intellectual Property Office, the entire disclosure of which is incorporated herein by reference.

BACKGROUND

1. Technical Field

Various embodiments may generally relate to an electronic device, and more particularly, to a semiconductor memory device and a method of operating the semiconductor memory device.

2. Related Art

A semiconductor memory device is implemented by using a semiconductor such as silicon (Si), germanium (Ge), gallium arsenide (GaAs), and indium phosphide (InP). The semiconductor memory device is divided into a volatile memory device and a nonvolatile memory device.

In the volatile memory device, when power supply is cut off, stored data is lost. The volatile memory device may be a static random access memory (SRAM), a dynamic RAM (DRAM), or a synchronous DRAM (SDRAM). In the nonvolatile memory device, although power supply is cut off, stored data is maintained. The nonvolatile memory device may be a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), or a ferroelectric RAM (FRAM). The flash memory is divided into a NOR type flash memory and a NAND type flash memory.

SUMMARY

A method of operating a semiconductor memory device including a plurality of memory cells may be provided. The method may include receiving externally from the semiconductor memory device, with an operation control signal generator, a request for performing a target operation. The method may include generating, with the operation control signal generator, a synchronizing signal for performing the target operation. The method may include detecting, with a temperature detect circuit, temperatures of memory cells included in the semiconductor memory device in response to the synchronizing signal.

In an embodiment, a semiconductor memory device may be provided. The semiconductor memory device may include a memory cell array including a plurality of memory cells. The semiconductor memory device may include an operation control signal generator configured to receive a request, externally from the semiconductor memory device, for performing a target operation and to generate a synchronizing signal for performing the target operation. The semiconductor memory device may include a temperature detect circuit configured to detect temperatures of the plurality of memory cells in response to the synchronizing signal.

DETAILED DESCRIPTION

Figure 1:
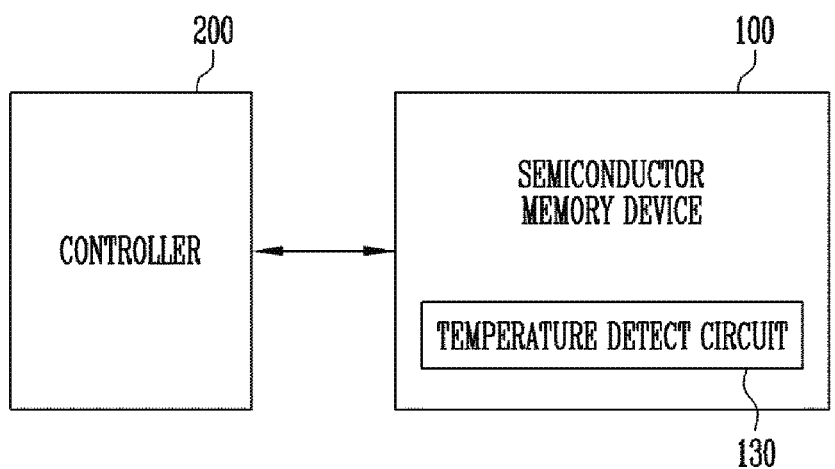
FIG. 1 is a block diagram illustrating a representation of an example of a configuration of a memory system.

The concepts will now be described more fully with reference to the accompanying drawings, in which examples of embodiments are illustrated. The concepts may, however, be embodied in many different forms and should not be construed as limited to the examples of embodiments set forth herein. Rather, these embodiments are provided so that this disclosure will be thorough and complete, and will fully convey the scope of the concepts to one of ordinary skill in the art.

It will be understood that, although the terms first and second, etc., may be used herein to describe various elements, these elements should not be limited by these terms. These terms are only used to distinguish one element from another element. For example, a first element may be named a second element and similarly a second element may be named a first element without departing from the scope of the disclosure.

It will also be understood that when an element is referred to as being "on" another element, it can be directly on the other element, or intervening elements may also be present. On the other hand, when an element is referred to as being "immediately on" or as "directly contacting" another element, it can be understood that intervening elements do not exist. Other expressions describing a relationship between elements, for example, "between" and "directly between" may be interpreted as described above.

Unless otherwise defined, terms such as "include" and "have" are for representing that characteristics, numbers, steps, operations, elements, and parts described in the specification or a combination of the above exist. It may be interpreted that one or more other characteristics, numbers, steps, operations, elements, and parts or a combination of the above may be added.

Unless otherwise defined, all terms (including technical and scientific terms) used herein have the same meaning as commonly understood by one of ordinary skill in the art.

In describing the embodiments, if an embodiment has been well known in the art and technical contents are not directly related to an embodiment of the present disclosure, descriptions thereof will be omitted. This is to allow the embodiment of the disclosure to be clearly understood without obscuring the gist of the embodiments of the present disclosure.

An embodiment may relate to a semiconductor memory device with an increased operation speed and a method of operating the same.

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in detail with reference to the accompanying drawings.

FIG. 1 is a block diagram illustrating a configuration of a memory system 50.

Referring to FIG. 1, the memory system 50 includes a semiconductor memory device 100 and a controller 200.

The semiconductor memory device 100 operates in response to control of the controller 200. The semiconductor memory device 100 includes a memory cell array having a plurality of memory blocks.

The semiconductor memory device 100 may be a NAND flash memory, a vertical NAND flash memory, a NOR flash memory, a resistive random access memory (RRAM), a phase-change RAM (PRAM), a magneto-resistive RAM (MRAM), a ferroelectric RAM (FRAM), or a spin transfer torque RAM (STT-RAM).

The semiconductor memory device 100 according to an example of an embodiment may be implemented by a three-dimensional array structure. An embodiment may be applied to a charge trap flash (CTF) in which a charge storage layer is formed of an insulating layer as well as a flash memory device in which a charge storage layer is formed of a conductive floating gate (FG).

The semiconductor memory device 100 receives a command and an address from the controller 200 through a channel and accesses a region selected by the address in the memory cell array. The semiconductor memory device 100 performs an internal operation corresponding to the command on the region selected by the address.

For example, the semiconductor memory device 100 may perform a program operation, a read operation, and an erase operation. During the program operation, the semiconductor memory device 100 programs data to the region selected by the address. During the read operation, the semiconductor memory device 100 reads data from the region selected by the address. During the erase operation, the semiconductor memory device 100 erases data stored in the region selected by the address.

Threshold voltages of the memory cells included in the semiconductor memory device 100 may vary in accordance with an external environment such as temperature, humidity, pressure, and electromagnetic force. For example, the threshold voltages of the memory cells may vary in accordance with a case in which the data is programmed at high temperature and a case in which the data is programmed at low temperature or a case in which the data is read at high temperature and a case in which the data is read at low temperature. Therefore, in order to compensate for a change in characteristic of a memory cell in accordance with temperature or to use the change in characteristic of the memory cell in accordance with the temperature for controlling the memory cell, the semiconductor memory device 100 needs to continuously monitor temperatures of the memory cells.

The semiconductor memory device 100 includes a temperature detect circuit 130. The temperature detect circuit 130 detects temperature of the memory cell array of the semiconductor memory device 100. The temperature detect circuit 130 may include a temperature sensor circuit for detecting the temperatures of the memory cells of the semiconductor memory device 100. The temperature detect circuit 130 may detect the temperatures of the memory cells in response to a signal input from the controller 200 or internal signals of the semiconductor memory device 100. The temperature detect circuit 130 outputs temperature information to a volatile memory storing the temperature information obtained by detecting the temperatures of the memory cells or a place requiring the temperature information.

According to various embodiments, the controller 200 may be connected to a plurality of semiconductor memory devices 100. In this case, the controller 200 may transmit a chip enable (CE) signal in order to select the semiconductor memory device 100 to be used. When the CE signal is input, the semiconductor memory device 100 is selected by the controller 200. The CE signal may be input to a CE pin of the semiconductor memory device 100. According to an embodiment, the temperature detect circuit 130 may detect the temperatures of the memory cells in response to at least one of the CE signal and the internal signals.

According to an embodiment, the controller 200 controls the semiconductor memory device 100 to perform the program operation, the read operation, or the erase operation. During the program operation, the controller 200 provides a program command, an address, and data to the semiconductor memory device 100 through a channel CH. During the read operation, the controller 200 provides a read command and an address to the semiconductor memory device 100 through the channel CH. During the erase operation, the controller 200 provides an erase command and an address to the semiconductor memory device 100 through the channel CH.

According to an embodiment, the controller 200 may include elements such as a RAM, a processing unit, a host interface, and a memory interface. The RAM is used as at least one of an operation memory of the processing unit, a cache memory between the semiconductor memory device 100 and a host, and a buffer memory between the semiconductor memory device 100 and the host. The processing unit controls an entire operation of the controller 200.

The host interface includes a protocol for exchanging data between the host and the controller 200. According to an embodiment, the controller 200 communicates with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface interfaces with the semiconductor memory device 100. For example, the memory interface includes a NAND interface or a NOR interface.

Figure 2:
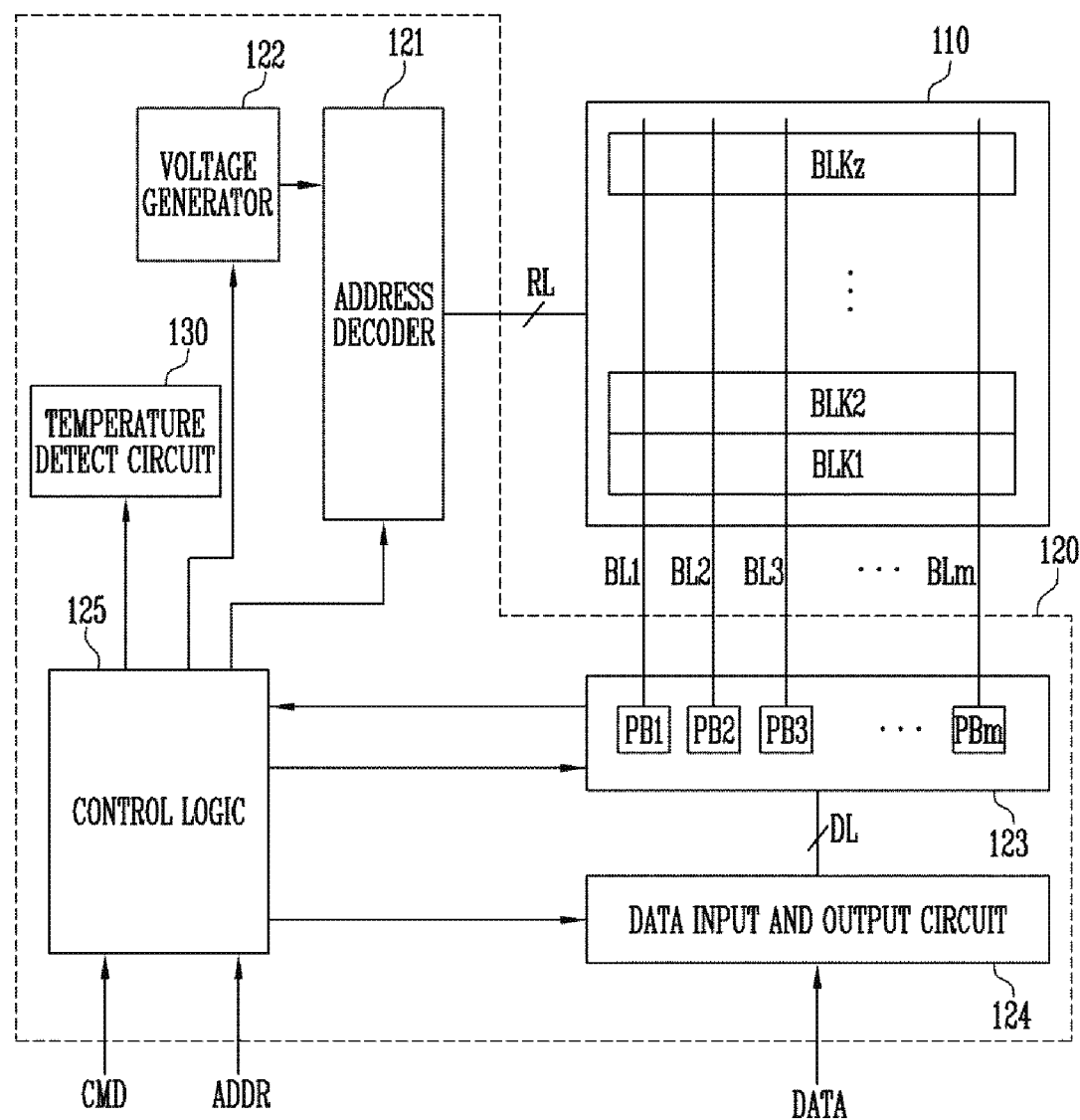
FIG. 2 is a block diagram illustrating a representation of an example of a semiconductor memory device according to an embodiment.
Figure 3:
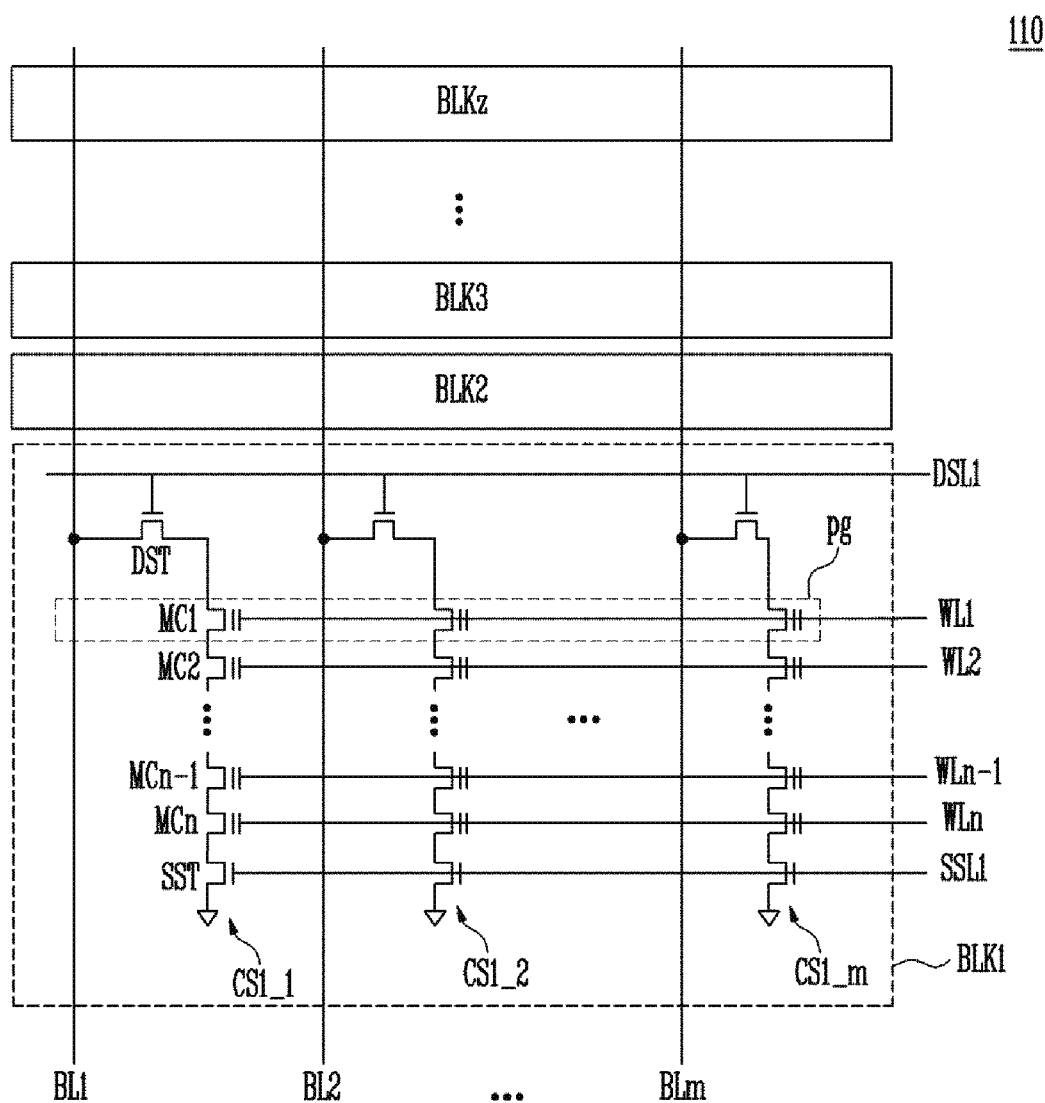
FIG. 3 is a view illustrating a representation of an example of a structure of the memory cell array of FIG. 2.

FIG. 2 is a block diagram illustrating a representation of an example of a semiconductor memory device according to an embodiment. FIG. 3 is a view illustrating a representation of an example of a structure of the memory cell array of FIG. 2.

Referring to FIG. 2, the semiconductor memory device 100 includes a memory cell array 110 and a peripheral circuit 120.

The memory cell array 110 includes a plurality of memory blocks BLK1 to BLKz. The plurality of memory blocks BLK1 to BLKz are connected to an address decoder 121 through row lines RL and are connected to a read and write circuit 123 through bit lines BL1 to BLm. Each of the plurality of memory blocks BLK1 to BLKz includes a plurality of memory cells. According to an embodiment, the plurality of memory cells are nonvolatile memory cells.

The plurality of memory cells included in the memory cell array 110 may be divided into a plurality of blocks in accordance with purposes to be used. Here, the plurality of blocks may be divided into main blocks and extra blocks and various set information items on operations of the memory cells may be stored in the extra blocks.

Referring to FIG. 3, the first to zth memory blocks BLK1 to BLKz are commonly connected to the first to mth bit lines BL1 to BLm. Referring to FIG. 2, for convenience sake, elements included in the first memory block BLK1 among the plurality of memory blocks BLK1 to BLKz are illustrated and elements included in each of the remaining memory blocks BLK2 to BLKz are omitted. Each of the remaining memory blocks BLK2 to BLKz is configured like or similar to the first memory block BLK1.

The memory block BLK1 includes a plurality of cell strings CS1_1~CS1_m. The first to mth cell strings CS1_1~CS1_m are respectively connected to the first to mth bit lines BL1 to BLm.

Each of the first to mth cell strings CS1_1~CS1_m includes a drain selection transistor DST, a plurality of serially connected memory cells MC1 to MCn, and a source selection transistor SST. The drain selection transistor DST is connected to a drain selection line DSL1. The first to nth memory cells MC1 to MCn are respectively connected to the first to nth word lines WL1 to WLn. The source selection transistor SST is connected to a source selection line SSL1. A drain side of the drain selection transistor DST is connected to a corresponding bit line. Drain selection transistors of the first to mth cell strings CS1_1~CS1_m are respectively connected to the first to mth bit lines BL1 to BLm. A source side of the source selection transistor SST is connected to a common source line CSL. According to an embodiment, the common source line CSL may be commonly connected to the first to zth memory blocks BLK1 to BLKz.

The drain selection line DSL1, the first to nth word lines WL1 to WLn, and the source selection line SSL1 are included in the row lines RL of FIG. 2. The drain selection line DSL1, the first to nth word lines WL1 to WLn, and the source selection line SSL1 are controlled by the address decoder 121. The common source line CSL (see FIG. 4) is controlled by a control logic 125 (see FIG. 2). The first to mth bit lines BL1 to BLm are controlled by the read and write circuit 123.

Referring to FIG. 2, the peripheral circuit 120 includes the address decoder 121, the voltage generator 122, the read and write circuit 123, a data input and output circuit 124, the control logic 125, and the temperature detect circuit 130.

The address decoder 121 is connected to the memory cell array 110 through the row lines RL. The address decoder 121 operates in response to control of the control logic 125. The address decoder 121 receives an address ADDR through the control logic 125.

According to an embodiment, programing and read operations of the semiconductor memory device 100 are performed in units of pages.

During the program and read operations, the address ADDR received by the control logic 125 includes a block address and a row address. The address decoder 121 decodes the block address in the received address ADDR. The address decoder 121 selects one of the memory blocks BLK1 to BLKz in accordance with the decoded block address.

The address decoder 121 decodes the row address in the received address ADDR. The address decoder 121 applies voltages received from the voltage generator 122 to the row lines RL in accordance with the decoded row address and selects a word line of the selected memory block.

During the program operation, the address decoder 121 applies a program pulse to the selected word line and applies a pass pulse lower than the program pulse to non-selected word lines. During the read operation, the address decoder 121 applies a read voltage to the selected word line and applies a pass voltage higher than the read voltage to the non-selected word lines.

According to an embodiment, the erase operation of the semiconductor memory device 100 is performed in units of memory blocks. During the erase operation, the address ADDR includes the block address. The address decoder 121 decodes the block address and selects a memory block in accordance with the decoded block address.

According to an embodiment, the address decoder 121 may include a block decoder, a word line decoder, and an address buffer.

The voltage generator 122 generates a plurality of voltages by using an external power source voltage supplied to the semiconductor memory device 100. The voltage generator 122 operates in response to the control of the control logic 125.

According to an embodiment, the voltage generator 122 regulates the external power source voltage and may generate an internal power source voltage. The internal power source voltage generated by the voltage generator 122 is used as an operating voltage of the semiconductor memory device 100.

According to an embodiment, the voltage generator 122 may generate the plurality of voltages by using the external power source voltage or the internal power source voltage. For example, the voltage generator 122 includes a plurality of pumping capacitors that receive the internal power source voltage and generates the plurality of voltages by selectively activating the plurality of pumping capacitors in response to the control of the control logic 125. The plurality of generated voltages are applied to the selected word line by the address decoder 121.

During the program operation, the voltage generator 122 generates a high voltage program pulse and a pass pulse lower than the program pulse. During the read operation, the voltage generator 122 generates a read voltage and a pass voltage higher than the read voltage. During the erase operation, the voltage generator 122 generates an erase voltage.

The read and write circuit 123 includes first to mth page buffers PB1 to PBm. The first to mth page buffers PB1 to PBm are connected to the memory cell array 110 through the first to mth bit lines BL1 to BLm. The first to mth page buffers PB1 to PBm operate in response to the control of the control logic 125.

The first to mth page buffers PB1 to PBm communicate data with the data input and output circuit 124. During the program operation, the first to mth page buffers PB1 to PBm receive data DATA to be stored through the data input and output circuit 124 and data lines DL.

During the program operation, the first to mth page buffers PB1 to PBm transmit the data DATA received through the data input and output circuit 124 to selected memory cells through the bit lines BL1 to BLm when a program pulse is applied to a selected word line. The memory cells of a selected page are programmed in accordance with the received data DATA. A memory cell connected to a bit line to which a program allow voltage (for example, a ground voltage) is applied has an increased threshold voltage. A threshold voltage of a memory cell connected to a bit line to which a program prevent voltage (for example, a power source voltage) is applied is maintained. During a program verify operation, the first to mth page buffers PB1 to PBm read page data from the selected memory cells through the bit lines BL1 to BLm.

During the read operation, the read and write circuit 123 reads the data DATA from the memory cells of the selected page through the bit lines BL and outputs the read data DATA to the input and output circuit 124. During the erase operation, the read and write circuit 123 may make the bit lines BL float.

According to an embodiment, the read and write circuit 123 may include a column select circuit.

The data input and output circuit 124 is connected to first to mth page buffers PB1 to PBm through the data lines DL. The data input and output circuit 124 operates in response to the control of the control logic 125. During a program, the data input and output circuit 124 receives the data DATA to be stored from an external controller (not illustrated).

The control logic 125 is connected to the address decoder 121, the voltage generator 122, the read and write circuit 123, and the data input and output circuit 124. The control logic 125 may control an entire operation of the semiconductor memory device 100. The control logic 125 receives the command CMD and the address ADDR from the external controller. The control logic 125 controls the address decoder 121, the voltage generator 122, the read and write circuit 123, and the data input and output circuit 124 in response to the command CMD. The control logic 125 transmits the address ADDR to the address decoder 121.

According to an embodiment, the control logic 125 may further include an operation control signal generator 126 (see FIG. 8) in order to execute the command CMD received from the external controller.

The operation control signal generator 126 may generate synchronizing signals for executing the command CMD received from the external controller. According to an embodiment, the generated synchronizing signals may be an operation start pulse informing that an operation starts and an operation end pulse informing that an operation ends.

The operation control signal generator 126 generates the operation start pulse that is a synchronizing signal representing that an operation of the peripheral circuit 120 starts and the operation end pulse that is a synchronizing signal representing that the operation of the peripheral circuit 120 ends in accordance with a write enable (WE) signal and a read enable (RE) signal that are received from the external controller and may transmit the generated signals to the peripheral circuit 120.

The temperature detect circuit 130 detects temperature of the memory cell array 110. The temperature detect circuit 130 may include a temperature sensor circuit for detecting the temperatures of the memory cells. The temperature detect circuit 130 may detect the temperatures of the memory cells in response to signals input from the outside or the internal signals of the semiconductor memory device 100. According to an embodiment, the temperature detect circuit 130 may receive the operation start pulse and the operation end pulse that are generated by the operation control signal generator 126. The temperature detect circuit 130 may output the temperature information to the volatile memory storing the temperature information obtained by detecting the temperatures of the memory cells or the place requiring the temperature information. According to an embodiment, the temperature detect circuit 130 may transmit the detected temperature information to the control logic 125 or may transmit the temperature information to an arbitrary register in which the temperature information is to be stored. An operation and a structure of the temperature detect circuit 130 will be described below with reference to FIGS. 6 to 9.

Figure 4:
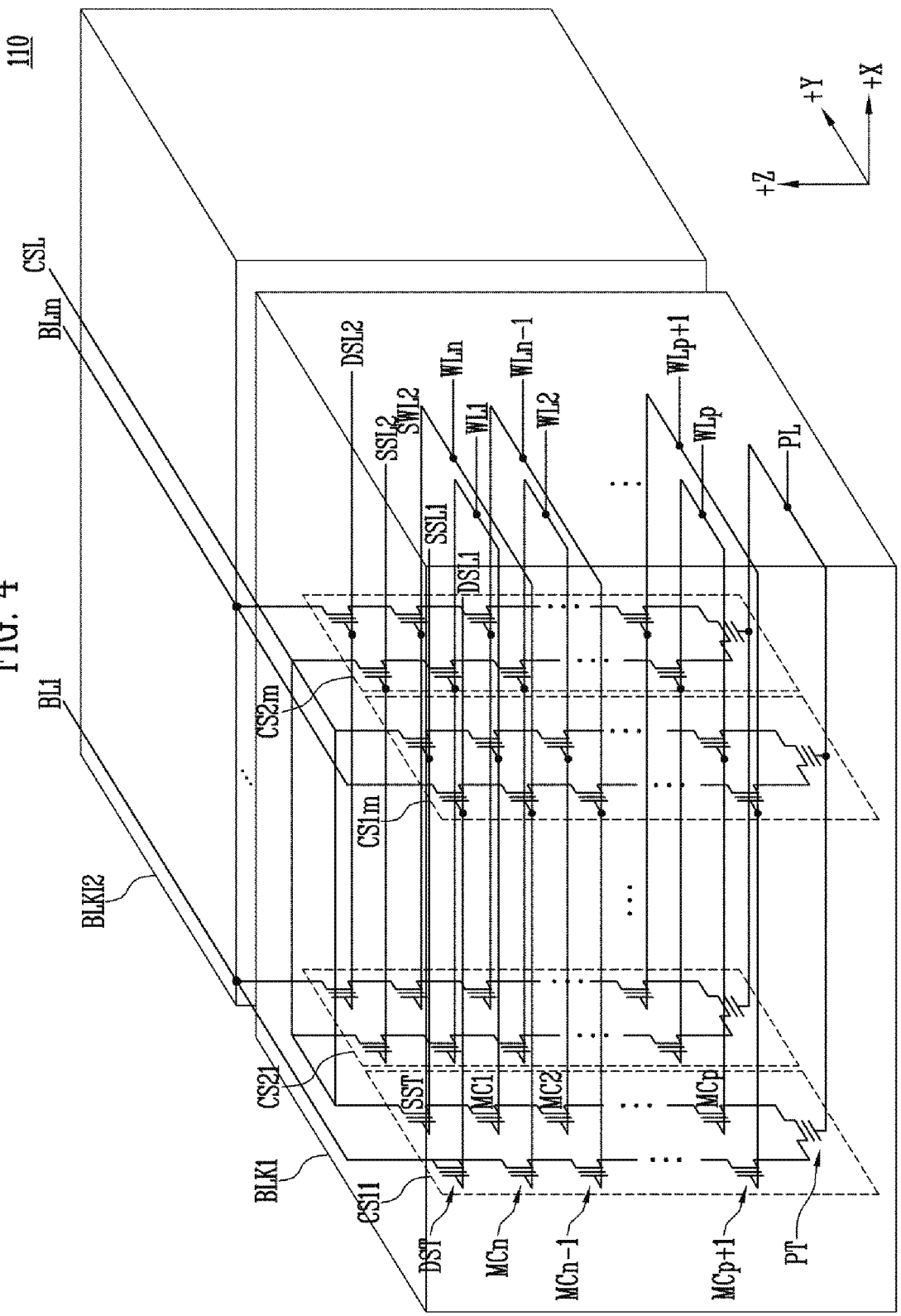
FIG. 4 is a view illustrating a representation of an example of an embodiment of a structure of the memory cell array of FIG. 2.

FIG. 4 is a view illustrating a representation of an example of an embodiment of a structure of the memory cell array 110 of FIG. 2.

Referring to FIG. 4, the memory cell array 110 includes the plurality of memory blocks BLK1 to BLKz. In FIG. 4, for convenience sake, an internal configuration of the first memory block BLK1 is illustrated and internal configurations of the remaining memory blocks BLK2 to BLKz are omitted. The second to zth memory blocks BLK2 to BLKz are configured like or substantially similar to the first memory block BLK1.

Referring to FIG. 4, the first memory block BLK1 includes a plurality of cell strings CS11 to CS1$m$ and CS21 to CS2$m$. According to an embodiment, the plurality of cell strings CS11 to CS1$m$ and CS21 to CS2$m$ may be U-shaped. In the first memory block BLK1, m cell strings are arranged in a row direction (that is, a +X direction). Referring to FIG. 4, it is illustrated that two cell strings are arranged in a column direction (a +Y direction). However, no less than three cell strings may be arranged in the column direction.

Each of the plurality of cell strings CS11 to CS1$m$ and CS21 to CS2$m$ includes at least one source select transistor SST, first to nth memory cells MC1 to MCn, a pipe transistor PT, and at least one drain select transistor DST.

The select transistors SST and DST and the memory cells MC1 to MCn may have similar structures. According to an embodiment, each of the select transistors SST and DST and the memory cells MC1 to MCn may include a channel layer, a tunneling insulating layer, a charge storage layer, and a blocking insulating layer. According to an embodiment, a pillar for providing the channel layer may be provided in each cell string. According to an embodiment, the pillar for providing at least one of the channel layer, the tunneling insulating layer, the charge storage layer, and the blocking insulating layer may be provided in each cell string.

The source select transistor SST of each cell string is connected between the common source line CSL and the memory cells MC1 to MCp.

According to an embodiment, source select transistors of cell strings arranged in the same row are connected to a source select line that extends in the row direction and source select transistors of cell strings arranged in different rows are connected to different source select lines. Referring to FIG. 4, the source select transistors of the cell strings CS11 to CS1$m$ in a first row are connected to the first source select line SSL1. The source select transistors of the cell strings CS21 to CS2$m$ in a second row are connected to a second source select line SSL2.

According to an embodiment, the source select transistors of the cell strings CS11 to CS1$m$ and CS21 to CS2$m$ may be commonly connected to one source select line.

The first to nth memory cells MC1 to MCn of each cell string are connected between the source select transistor SST and the drain select transistor DST.

The first to nth memory cells MC1 to MCn are divided into the first to pth memory cells MC1 to MCp and (p+1)th to nth memory cells MCp+1 to MCn. The first to pth memory cells MC1 to MCp are sequentially arranged in a direction opposite to a +Z direction and are serially connected between the source select transistor SST and the pipe transistor PT. The (p+1)th to nth memory cells MCp+1 to MCn are sequentially arranged in the +Z direction and are serially connected between the pipe transistor PT and the drain select transistor DST. The first to pth memory cells MC1 to MCp and the (p+1)th to nth memory cells MCp+1 to MCn are connected through the pipe transistor PT. Gates of the first to nth memory cells MC1 to MCn of each cell string are respectively connected to the first to nth word lines WL1 to WLn.

According to an embodiment, at least one of the first to nth memory cells MC1 to MCn may be used as a dummy memory cell. When the dummy memory cell is provided, a voltage or a current of a corresponding cell string may be stably controlled. Therefore, reliability of data stored in the memory block BLK1 may improve.

A gate of the pipe transistor PT of each cell string is connected to a pipe line PL.

The drain select transistor DST of each cell string is connected between a corresponding bit line and the memory cells MC(p+1) to MCn. Cell strings arranged in the row direction are connected to a drain select line that extends in the row direction. Drain select transistors of the cell strings CS11 to CS1$m$ of the first row are connected to the first drain select line DSL1. Drain select transistors of the cell strings CS21 to CS2$m$ of the second row are connected to the second drain select line DSL2.

Cell strings arranged in the column direction are connected to a bit line that extends in the column direction. Referring to FIG. 4, the cell strings CS11 and CS21 in a first column are connected to the first bit line BL1. The cell strings CS1$m$ and CS2$m$ in an mth column are connected to the mth bit line BLm.

Memory cells connected to the same word line in the cell strings arranged in the row direction form one page. For example, memory cells connected to the first word line WL1 among the cell strings CS11 to CS1$m$ in the first row form one page. Memory cells connected to the first word line WL1 among the cell strings CS21 to CS2$m$ in the second row form one page. One of the drain select lines DSL1 and DSL2 is selected so that cell strings arranged in one row direction are selected. One of the word lines WL1 to WLn is selected so that one page is selected among the selected cell strings.

Figure 5:
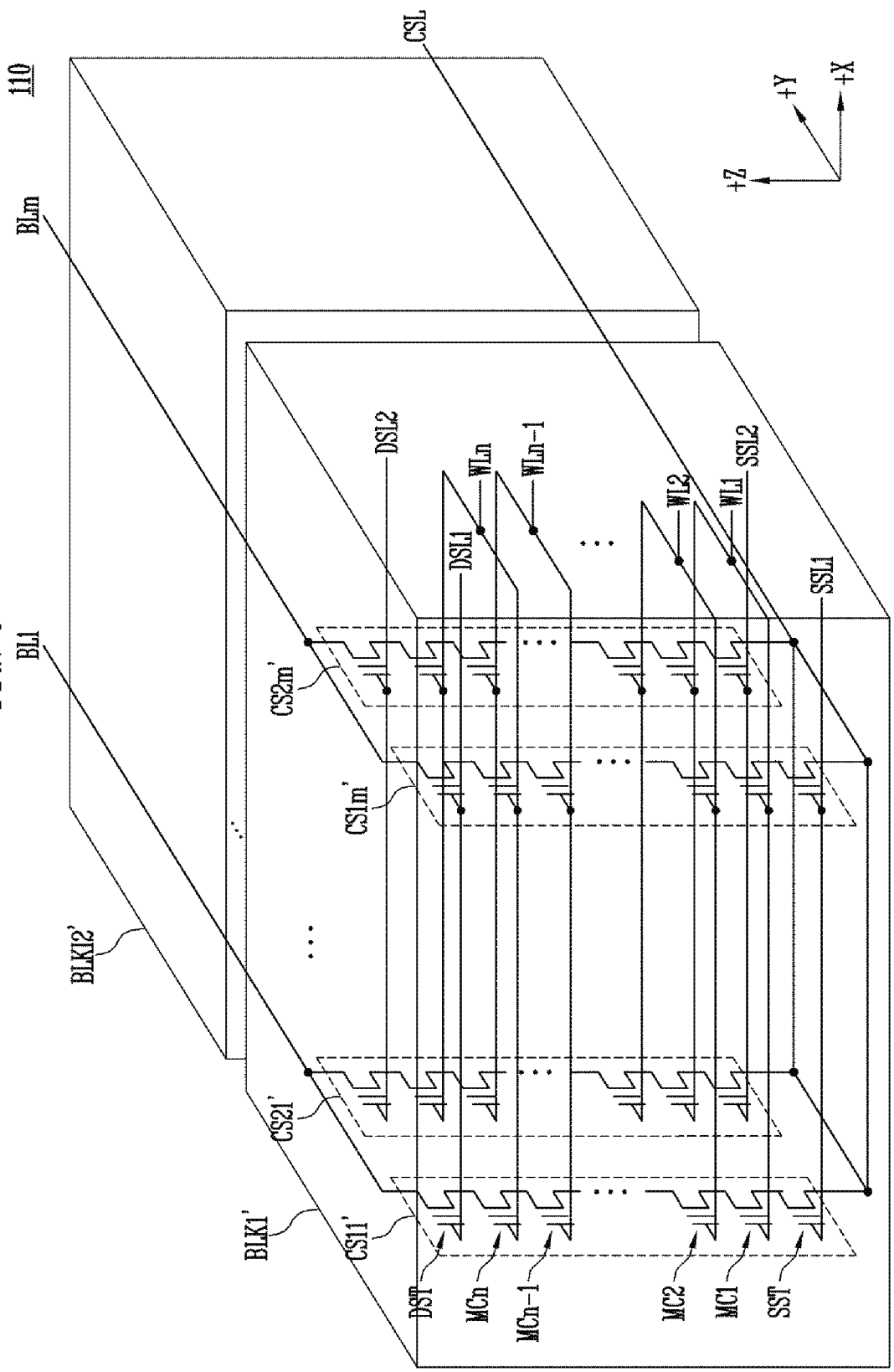
FIG. 5 is a view illustrating a representation of an example of an embodiment of a structure of the memory cell array of FIG. 2.

FIG. 5 is a view illustrating an embodiment of a structure of the memory cell array 110 of FIG. 2.

Referring to FIG. 5, the memory cell array 110 includes a plurality of memory blocks BLK1' to BLKz'. In FIG. 5, for convenience sake, an internal configuration of the first memory block BLK1' is illustrated and internal configurations of the remaining memory blocks BLK2' to BLKz' are omitted. The second to zth memory blocks BLK2' to BLKz' are configured like or similar to the first memory block BLK1'.

The first memory block BLK1' includes a plurality of cell strings CS11' to CS1$m$' and CS21' to CS2$m$'. The plurality of cell strings CS11' to CS1$m$' and CS21' to CS2$m$' extend in the +Z direction. In the first memory block BLK1, m cell strings are arranged in the +X direction. Referring to FIG. 5, it is illustrated that two cell strings are arranged in the +Y direction. However, no less than three cell strings may be arranged in the column direction.

Each of the plurality of cell strings CS11' to CS1$m$' and CS21' to CS2$m$' includes at least one source select transistor SST, first to nth memory cells MC1 to MCn, and at least one drain select transistor DST.

The source select transistor SST of each cell string is connected between the common source line CSL and the memory cells MC1 to MCn. Source select transistors of cell strings arranged in the same row are connected to the same source select line. The source select transistors of the cell strings CS11' to CS1$m$' in a first row are connected to the first source select line SSL1. The source select transistors of the cell strings CS21' to CS2$m$' in a second row are connected to a second source select line SSL2. According to an embodiment, the source select transistors of the cell strings CS11' to CS1$m$' and CS21' to CS2$m$' may be commonly connected to one source select line.

The first to nth memory cells MC1 to MCn of each cell string are serially connected between the source select transistor SST and the drain select transistor DST. Gates of the first to nth memory cells MC1 to MCn are respectively connected to the first to nth word lines WL1 to WLn.

According to an embodiment, at least one of the first to nth memory cells MC1 to MCn may be used as a dummy memory cell. When the dummy memory cell is provided, a voltage or a current of a corresponding cell string may be stably controlled. Therefore, reliability of data stored in the memory block BLK1' improves.

The drain select transistor DST of each cell string is connected between a corresponding bit line and the memory cells MC1 to MCn. Drain select transistors of the cell strings arranged in the row direction are connected to a drain select line that extends in the row direction. Drain select transistors of the cell strings CS11' to CS1$m$' of the first row are connected to the first drain select line DSL1. Drain select transistors of the cell strings CS21' to CS2$m$' of the second row are connected to the second drain select line DSL2.

As a result, the memory block BLK1' of FIG. 5 has an equivalent circuit similar to or substantially similar to the memory block BLK1 of FIG. 4 excluding that the pipe transistor PT is excluded from each cell string.

Figure 6:
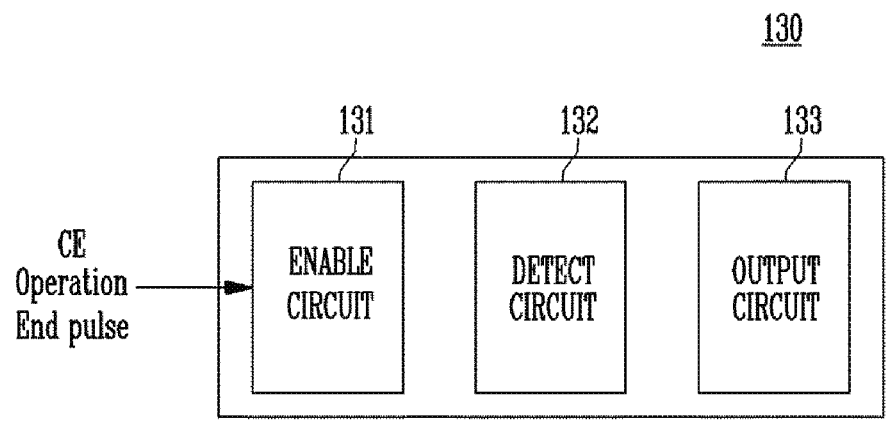
FIG. 6 is a block diagram illustrating a representation of an example of a structure of a temperature detect circuit 130 of a semiconductor memory device according to an embodiment.

FIG. 6 is a block diagram illustrating a structure of a temperature detect circuit 130 of a semiconductor memory device according to an embodiment.

Referring to FIG. 6, the temperature detect circuit 130 may include an enable circuit 131, a detect circuit 132, and an output circuit 133. In FIG. 6, it is illustrated that the temperature detect circuit 130 includes only the enable circuit 131, the detect circuit 132, and the output circuit 133. However, the temperature detect circuit 130 may further include various modules or circuits in accordance with an operation thereof.

The enable circuit 131 generates a temperature detection enable signal so that the detect circuit 132 detects temperatures of memory cells. The temperature detection enable signal generated by the enable circuit 131 is transmitted to the detect circuit 132. The enable circuit 131 generates the temperature detection enable signal in response to at least one of the CE signal or the operation end pulse. A structure of the enable circuit 131 will be described below with reference to FIG. 9.

The detect circuit 132 receives the temperature detection enable signal generated by the enable circuit 131 in response to at least one of the CE signal and the operation end pulse. The detect circuit 132 may include a temperature sensor for detecting the temperatures of the memory cells. Since a method or a principle for the detect circuit 132 detecting the temperatures of the memory cells is not limited thereto, a description thereof will not be given.

According to an embodiment, the detect circuit 132 may continuously detect the temperatures while the temperature detection enable signal is input or may detect the temperatures by a predetermined number of times or time when the temperature detection enable signal is sensed.

The output circuit 133 outputs information on the temperatures detected by the detect circuit 132 to a module or a device other than the temperature detect circuit 130.

Figure 7:
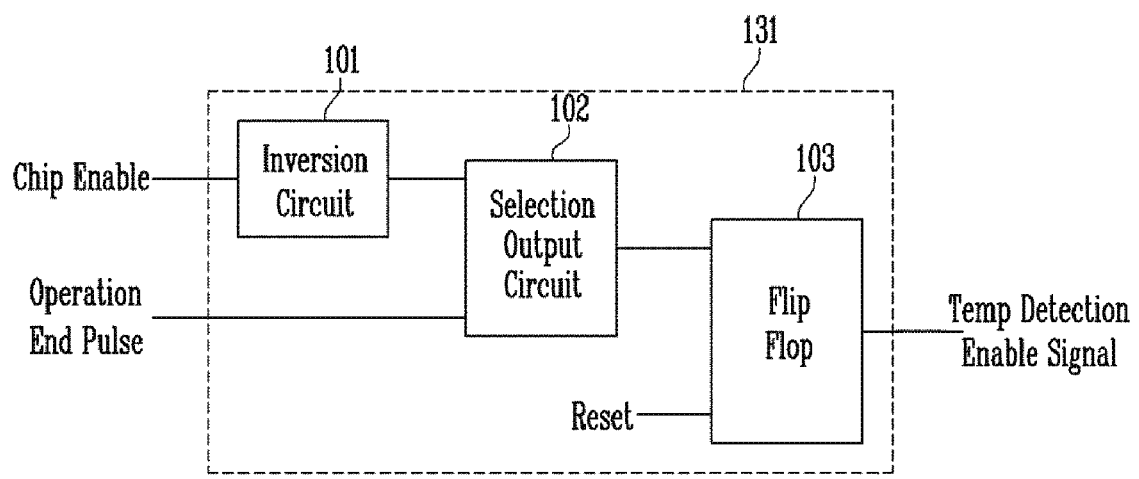
FIG. 7 is a block diagram illustrating a representation of an example of a structure of the enable circuit of FIG. 6.

FIG. 7 is a block diagram illustrating a representation of an example of a structure of the enable circuit 131 of FIG. 6.

Referring to FIG. 7, the enable circuit 131 may include an inversion circuit 101, a selection output circuit 102, and a flip-flop 103.

The inversion circuit 101 receives the CE signal, inverts the received CE signal, and outputs the inverted CE signal to the selection output circuit 102. The inversion circuit 101 outputs "low" when the CE signal has a logic value "high" and may output "high" when the CE signal has a logic value "low". In accordance with the output of the inversion circuit 101, in a state in which the semiconductor memory device is selected by the controller, that is, in a state in which the CE signal is input, the output of the inversion circuit 101 may have a logic value "low". When the semiconductor memory device is not selected, since the CE signal is disabled, the output of the inversion circuit 101 may be a logic value "high". According to an embodiment, the inversion circuit 101 may continuously invert the input CE signal to transmit the inverted CE signal and may detect a rising or falling edge to transmit a signal to the selection output circuit 102 only when the rising or falling edge is detected. According to an embodiment, the inversion circuit 101 may be, for example but not limited to, an inverter gate.

The selection output circuit 102 receives the output of the inversion circuit 101 and the operation end pulse that is the internal signal of the semiconductor memory device. The selection output circuit 102 has an arbitrary output value when one of the output of the inversion circuit 101 and the operation end pulse is enabled. The output of the selection output circuit 102 may have a logic value "high" or "low".

The operation end pulse may be an internal signal generated when the semiconductor memory device stops performing an operation requested by the controller. According to an embodiment, the operation end pulse may be generated by the operation control signal generator 126 of FIGS. 2 and 8 (i.e., control logic 125 including the operation control signal generator 126). When the operation end pulse is enabled, the memory cells of the semiconductor memory device maintain to be idle without operating. Since one of inputs of the selection output circuit 102 is the output of the inversion circuit 101, the selection output circuit 102 generates an output when an operation ends and the operation end pulse is enabled although the semiconductor memory device is selected by the controller. According to an embodiment, when one of input signals is input, the selection output circuit 102 may continuously maintain the output, detects a rising or falling edge of the one of the input signals, and may have the output only when the rising or falling edge is detected. According to an embodiment, the selection output circuit 102 may be, for example but not limited to, a logic gate. The logic gate of the selection output circuit 102 may include for example but not limited to a logic gate configured to perform an OR operation.

The flip-flop 103 receives the output of the selection output circuit 102 and outputs the temperature detection enable signal. The flip-flop 103 maintains an arbitrary output and, when an input signal changes, may reflect the change to the output. A reset (Reset) input to the flip-flop 103 is for initialization when power is turned off in the semiconductor memory device or the temperature detect operation is completed.

Referring to FIG. 7, the flip-flop 103 is illustrated. However, any electronic circuit having a latch function capable of outputting the temperature detection enable signal may be used as the flip-flop 103.

According to an embodiment, a phase of a signal input to the flip-flop 103 is not fixed in order to output the temperature detection enable signal. That is, the rising and/or falling edge may operate and the circuit of FIG. 7 may be changed into various combination circuits for controlling the CE signal and the operation end pulse to be suitable for phases.

The chip enable CE signal and the operation end pulse include all the signals capable of representing functions thereof.

Figure 8:
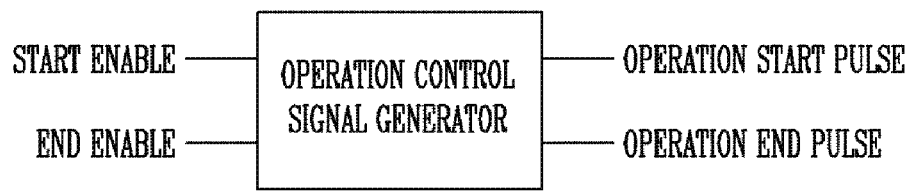
FIG. 8 is a view illustrating a representation of an example of an operation of the operation control signal generator of FIG. 2.

FIG. 8 is a view illustrating a representation of an example of an operation of the operation control signal generator of FIG. 2 included in the control logic 125.

The semiconductor memory device may receive commands corresponding to corresponding operations from the external controller in order to perform operations requested by the host. For example, the semiconductor memory device may receive a command representing a specific operation, an address representing an address of a memory cell that performs a corresponding operation, and data used for the command from the external controller. When the semiconductor memory device receives the command, the address, and the data from the controller, the semiconductor memory device performs a corresponding operation. In order for the semiconductor memory device to perform the corresponding operation, the operation control signal generator 126 generates a synchronizing signal for driving peripheral circuits included in the semiconductor memory device and may transmit the generated synchronizing signal to the peripheral circuits.

The operation control signal generator 126 receives a start enable signal and an end enable signal. The start enable signal is directly received from the external controller or may be received in a method in which the control logic receives the signals received from the external controller.

According to an embodiment, the start enable signal may be one of the write enable signal WE or the read enable signal RE transmitted by the external controller. During the program operation or the erase operation, the start enable signal may be the write enable signal WE. During the read operation, the start enable signal may be the read enable signal RE.

The operation control signal generator 126 generates the operation start pulse when the start enable signal is input. According to an embodiment, the operation start pulse may be transmitted to the temperature detect circuit 130 of FIG. 2.

When an operation requested by the external controller stops being performed, the operation control signal generator 126 generates the operation end pulse and may transmit the generated operation end pulse to the peripheral circuit 120. When the end enable signal is received, the operation control signal generator 126 generates the operation end pulse and may transmit the generated operation end pulse to the peripheral circuit 120.

According to an embodiment, the end enable signal may be input from the peripheral circuit 120. For example, during the program operation or the erase operation, when data is input to a state register representing pass or fail, the end enable signal may be input to the operation control signal generator 126 in response to the input data. During the read operation, when data to be transmitted to the external controller is input to a data register, the end enable signal may be input.

The operation control signal generator 126 generates the operation end pulse when the end enable signal is input. According to an embodiment, the operation end pulse may be transmitted to the temperature detect circuit 130 of FIG. 2.

Figure 9:
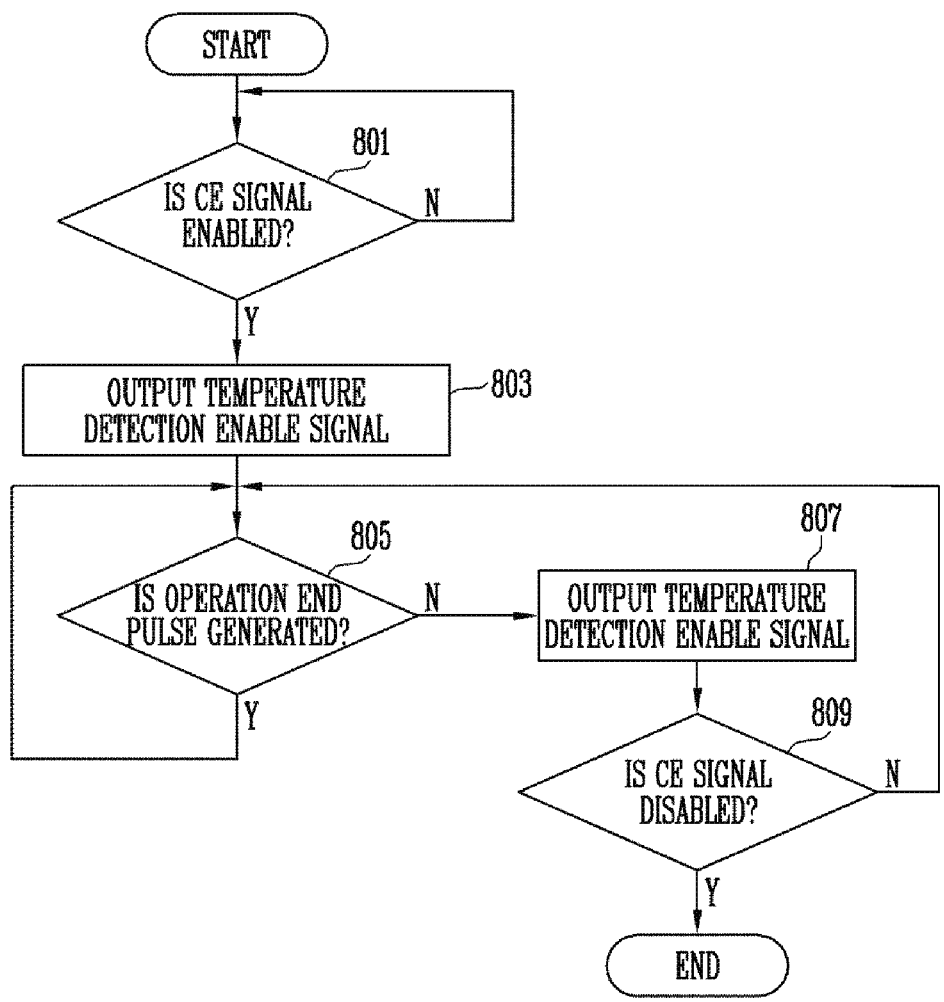
FIG. 9 is a flowchart illustrating a representation of an example of a method of a semiconductor memory device outputting a temperature detection enable signal.
Figure 10:
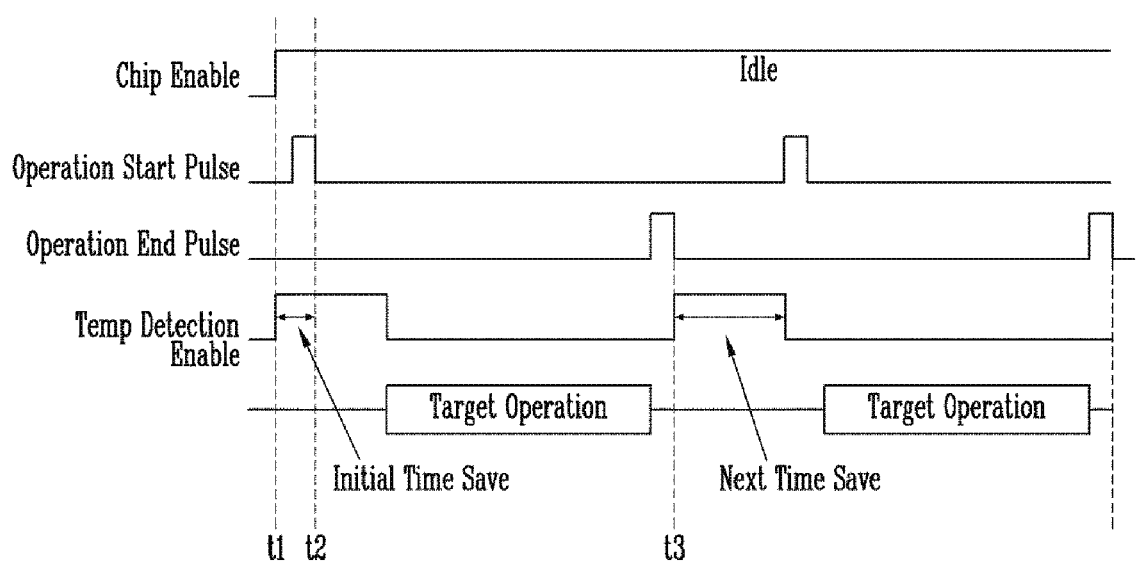
FIG. 10 is a view illustrating a representation of an example of the timing of an input and output signal of an enable circuit of a semiconductor memory device.

FIGS. 9 and 10 are views illustrating representations of examples of operations of a semiconductor memory device according to an embodiment.

FIG. 9 is a flowchart illustrating a representation of an example of a method of a semiconductor memory device outputting a temperature detection enable signal. FIG. 10 is a view illustrating a representation of an example of the timing of an input and output signal of an enable circuit of a semiconductor memory device.

Referring to FIGS. 9 and 10, the semiconductor memory device may determine whether the CE signal is enabled 801. When the CE signal is enabled, it may be noted that the semiconductor memory device is selected by the controller.

When the CE signal is transited from being disabled to being enabled, the semiconductor memory device outputs the temperature detection enable signal 803. That is, the semiconductor memory device outputs the temperature detection enable signal according to the rising edge of the CE signal.

For example, at a point of time t1, the CE signal of the semiconductor memory device is activated. When the CE signal is activated, it is estimated that the controller requests the semiconductor memory device to perform an operation. However, delay may occur between a point of time at which the CE signal is transited to being enabled and a point of time t2 at which the operation requested by the controller starts in accordance with signal processing between the controller and a semiconductor memory or in accordance with the memory cell of the semiconductor memory device maintaining a standby state for a time when the controller transmits the command, the address, and the data to the semiconductor memory. The enable circuit of the temperature detect circuit of the semiconductor memory device outputs the temperature detection enable signal in response to the CE signal (t1 to t2). According to an embodiment, the temperatures of the memory cells of the semiconductor memory device are detected while the memory cells of the semiconductor memory device are in standby states by performing a temperature detect operation in response to the CE signal so that it is possible to reduce time used for detecting the temperatures of the memory cells (initial time save).

In a period t2 to t3, the semiconductor memory device performs a target operation. In the target operation, it may be required to perform the temperature detect operation among the operations requested by the controller to the semiconductor memory device. According to an embodiment, the target operation may include a program related operation, a read related operation, and an erase related operation.

In operation 805, the semiconductor memory device may determine whether the operation end pulse is generated. That is, when the target operation is completed, the semiconductor memory device transmits the operation end pulse representing that an operation internally ends to the temperature detect circuit. After the operation end pulse is generated, the semiconductor memory device waits for new requests input from the controller (idle). When it is determined in the operation 805 that the operation end pulse is input, the process proceeds to operation 807 and the semiconductor memory device outputs the temperature detection enable signal according to the falling edge of the operation end pulse. That is, the semiconductor memory device detects a falling edge of the operation end pulse and performs the temperature detect operation at a point of time t3. Therefore, before the subsequent operation start pulse is applied, for a time when the memory cells are in standby states, the semiconductor memory device performs the temperature detect operation. Therefore, after the temperature detect operation is performed at an initial stage, the semiconductor memory device detects the temperatures of the memory cells while every operation end pulse is applied so that it is possible to reduce time used for detecting the temperatures of the memory cells (next time save).

In operation 809, it is determined whether the CE signal is disabled. When it is determined that the semiconductor memory device is not disabled, the process proceeds to the operation 805 and the semiconductor memory device outputs the temperature detection enable signal.

Figure 11:
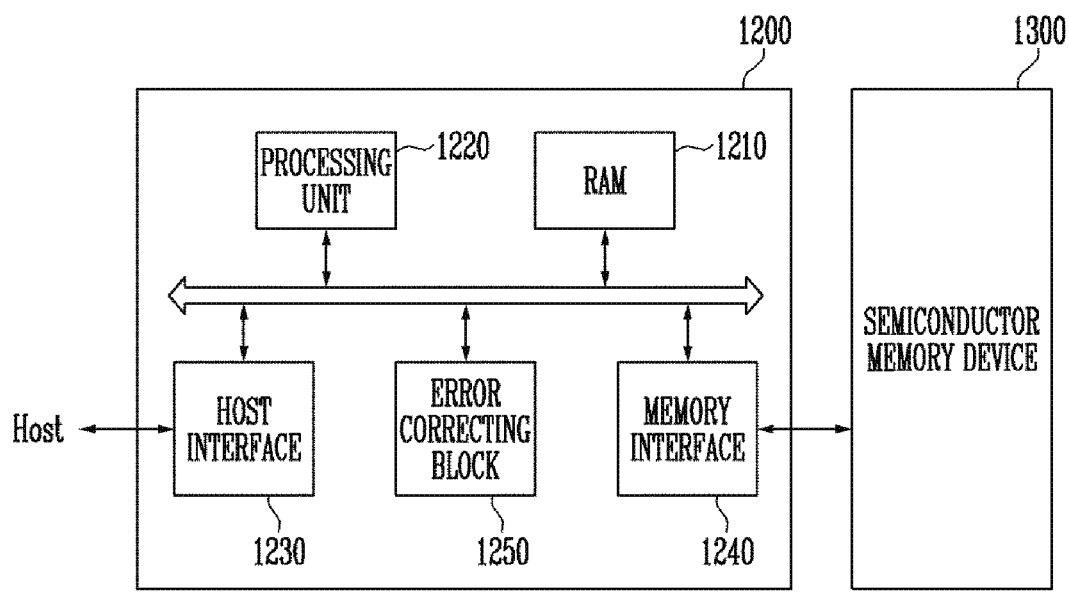
FIG. 11 is a block diagram illustrating a representation of an example of a memory system including the semiconductor memory device of FIG. 2.

FIG. 11 is a block diagram illustrating a representation of an example of a memory system 1000 including the semiconductor memory device of FIG. 2.

Referring to FIG. 11, the memory system 1000 includes a semiconductor memory device 1300 and a controller 1200.

The semiconductor memory device 1300 may be configured and operate like the semiconductor memory device 100 described with reference to FIG. 2. Hereinafter, description of repeated contents will not be given.

The controller 1200 is connected to a host and the semiconductor memory device 1300. In response to a request from the host, the controller 1200 accesses the semiconductor memory device 1300. For example, the controller 1200 controls a read operation, a program operation, an erase operation, and a background operation of the semiconductor memory device 1300. The controller 1200 controls interface between the semiconductor memory device 1300 and the host. The controller 1200 drives firmware for controlling the semiconductor memory device 1300.

The controller 1200 includes a random access memory (RAM) 1210, a processing unit 1220, a host interface 1230, a memory interface 1240, and an error correcting block 1250.

The RAM 1210 is used as at least one of an operation memory of the processing unit 1220, a cache memory between the semiconductor memory device 1300 and the host, and a buffer memory between the semiconductor memory device 1300 and the host.

The processing unit 1220 controls an entire operation of the controller 1200.

The processing unit 1220 randomizes data received from the host. For example, the processing unit 1220 randomizes the data received from the host by using a randomizing seed. The randomized data is provided to the semiconductor memory device 1300 as the data DATA (refer to FIG. 1) to be stored and is programed in the memory cell array 110 (refer to FIG. 1).

The processing unit 1220 randomizes the data received from the semiconductor memory device 1300 during the read operation. For example, the processing unit 1220 derandomizes the data received from the semiconductor memory device 1300 by using a derandomizing seed. The derandomized data is output to the host.

According to an embodiment, the processing unit 1220 may perform randomize and derandomize by driving software or firmware.

The host interface 1230 includes protocols for exchanging data between the host and the controller 1200. According to an example of an embodiment, the controller 1200 communicates with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA (SATA) protocol, a parallel-ATA (PATA) protocol, a small computer small interface (SCSI) protocol, an enhanced small disk interface (ESDI) protocol, and an integrated drive electronics (IDE) protocol.

The memory interface 1240 interfaces with the semiconductor memory device 1300. For example, the memory interface 1240 includes a NAND interface or a NOR interface.

The error correcting block 1250 detects errors of the data received from the semiconductor memory device 1300 by using an error correcting code (ECC) and corrects the detected errors.

The controller 1200 and the semiconductor memory device 1300 may be integrated into one semiconductor device. According to an example of an embodiment, the controller 1200 and the semiconductor memory device 1300 are integrated into one semiconductor device and may form a memory card. For example, the controller 1200 and the semiconductor memory device 1300 are integrated into one semiconductor device and may form a memory card such as a personal computer memory card international association (PCMCIA) card, a compact flash (CF) card, a smart media card (SM and SMC), a memory stick, a multimedia card (MMC, RS-MMC, and MMCmicro), an SD card (SD, miniSD, microSD, and SDHC), and a universal flash memory device (UFS).

The controller 1200 and the semiconductor memory device 1300 are integrated into one semiconductor device and may form a semiconductor drive (a solid state drive (SSD)). The semiconductor drive (SSD) includes a storage device formed to store data in a semiconductor memory. When the memory system 1000 is used as the semiconductor drive (SSD), an operation speed of the host connected to the memory system 1000 remarkably increases.

According to an example, the memory system 1000 is provided as one of various elements of an electronic device such as one of various elements that form a computer, an ultra-mobile PC (UMPC), a work station, a net-book, a personal digital assistant (PDA), a portable computer, a web tablet, a wireless phone, a mobile phone, a smart phone, an e-book, a portable multimedia player (PMP), a portable gamer, a navigator, a black box, a digital camera, a three-dimensional television set, a digital audio recorder, a digital audio player, a digital picture recorder, a digital picture player, a digital video recorder, a digital video player, a device capable of transmitting and receiving information in a wireless environment, one of various electronic devices that form a home network, one of various electronic devices that form a computer network, one of various electronic devices that form a telematics network, an RFID device, or a computing system.

According to an example of an embodiment, the semiconductor memory device 1300 or the memory system 1000 may be mounted as a package in various forms. For example, the semiconductor memory device 1300 or the memory system 1000 is packaged in a method such as package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a thin quad flat pack (TQFP), a system in package (SIP), a multichip package (MCP), a wafer-level fabricated package (WFP), and a wafer-level processed stack package (WSP) and may be mounted.

Figure 12:
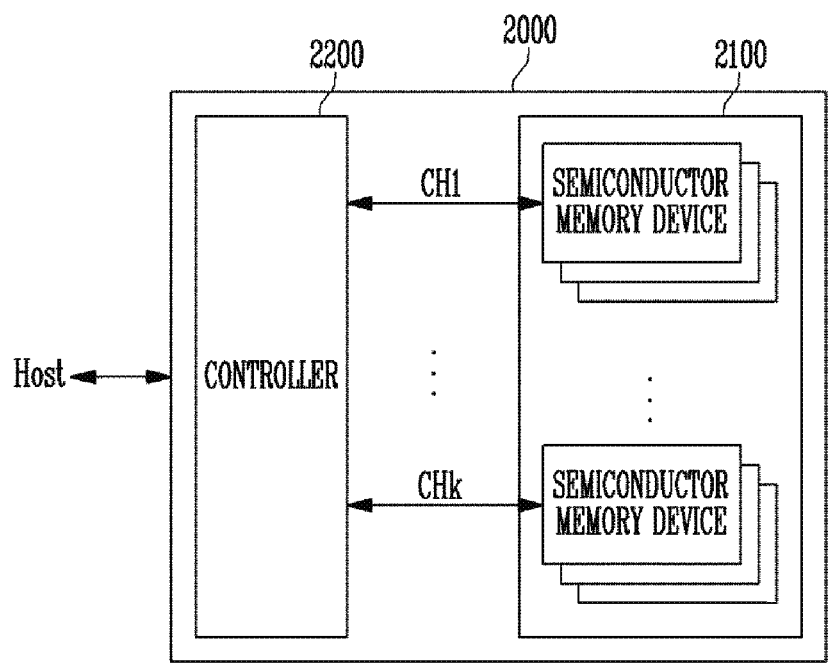
FIG. 12 is a block diagram illustrating a representation of an example of an application example of the memory system of FIG. 11.

FIG. 12 is a block diagram illustrating a representation of an example of an application example 2000 of the memory system 1000 of FIG. 11.

Referring to FIG. 12, the memory system 2000 includes a semiconductor memory device 2100 and a controller 2200. The semiconductor memory device 2100 includes a plurality of semiconductor memory chips. The plurality of semiconductor memory chips are divided into a plurality of groups.

Referring to FIG. 12, it is illustrated that the plurality of groups communicate with the controller 2200 through first to kth channels CH1 to CHk. Each semiconductor memory chip is configured and operates like one of the semiconductor memory device 100 described with reference to FIG. 1.

Each group communicates with the controller 2200 through a common channel. The controller 2200 is configured like the controller 1200 described with reference to FIG. 11 and controls the plurality of semiconductor memory chips of the memory device 2100 through the plurality of channels CH1 to CHk.

Referring to FIG. 12, it is illustrated that the plurality of semiconductor memory chips are connected to one channel. However, the memory system 200 may be modified so that one semiconductor memory chip is connected to one channel.

Data may be exchanged between a host (Host) and the controller 2200. According to an example of an embodiment, the controller 2200 communicates with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA (SATA) protocol, a parallel-ATA (PATA) protocol, a small computer small interface (SCSI) protocol, an enhanced small disk interface (ESDI) protocol, and an integrated drive electronics (IDE) protocol.

Figure 13:
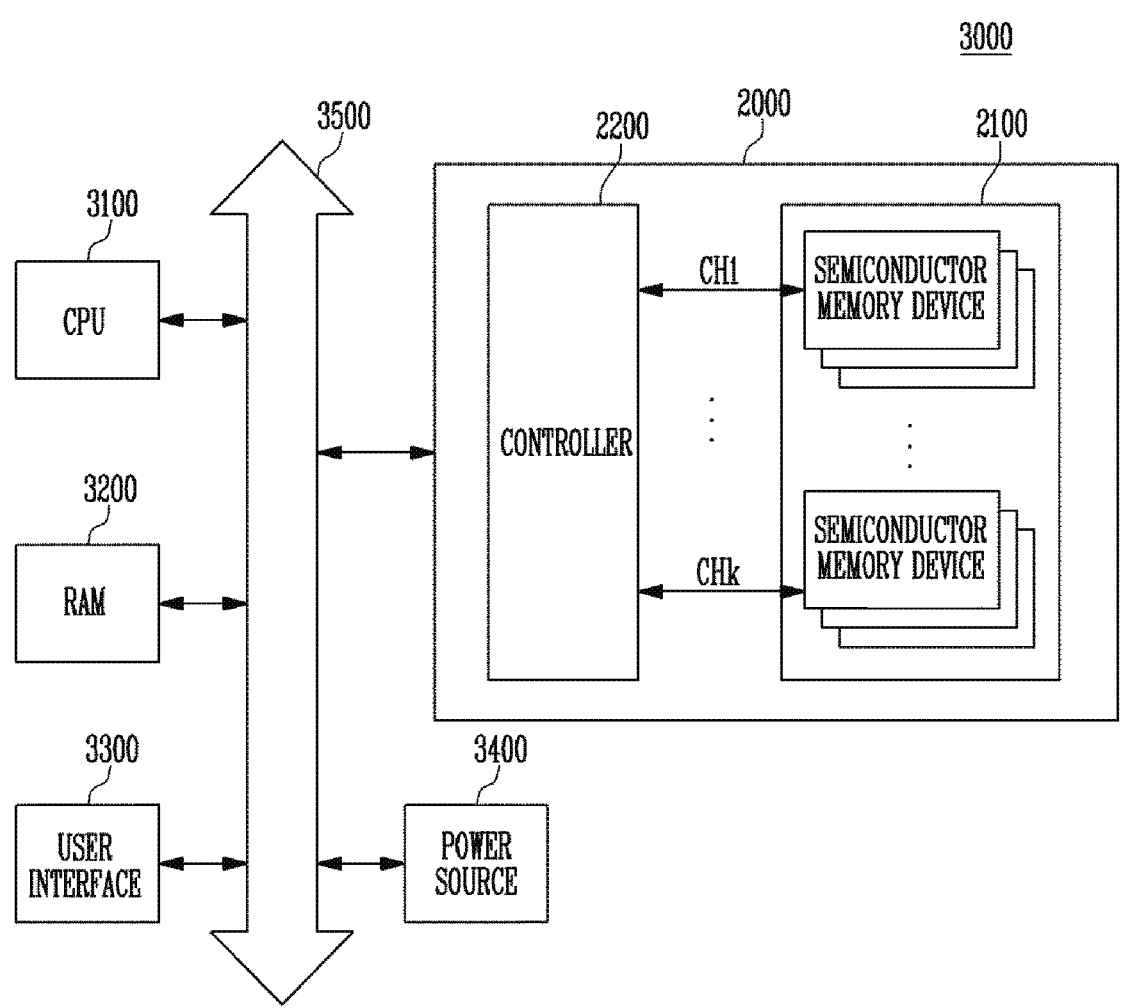
FIG. 13 is a block diagram illustrating a representation of an example of a computing system including the memory system illustrated with reference to FIG. 12.

FIG. 13 is a block diagram illustrating a representation of an example of a computing system 3000 including the memory system 2000 illustrated with reference to FIG. 12.

Referring to FIG. 13, the computing system 3000 includes a central processing unit (CPU) 3100, a RAM 3200, a user interface 3300, a power source 3400, a system bus 3500, and the memory system 2000.

The memory system 2000 is electrically connected to the CPU 3100, the RAM 3200, the user interface 3300, and the power source 3400 through the system bus 3500. Data provided through the user interface 3300 or processed by the CPU 3100 is stored in the memory system 2000.

Referring FIG. 13, the semiconductor memory device 2100 is illustrated as being connected to the system bus 3500 through the controller 2200. However, the semiconductor memory device 2100 may be directly connected to the system bus 3500. A function of the controller 2200 is performed by the CPU 3100 and the RAM 3200.

Referring to FIG. 13, it is illustrated that the memory system 2000 described with reference to FIG. 12 is provided. However, the memory system 2000 may be replaced by the memory system 1000 described with reference to FIG. 12. According to an embodiment, the computing system 3000 may include both the memory systems 1000 and 2000 described with reference to FIGS. 11 and 12.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims.

What is claimed is:

1. A method of operating a semiconductor memory device including a plurality of memory cells, the method comprising:
   receiving a request for performing a target operation from a controller configured to control the semiconductor memory device;
   generating a synchronizing signal for performing the target operation; and
   detecting temperatures of memory cells included in the semiconductor memory device in response to the synchronizing signal,
   wherein the target operation includes at least one of a program related operation, a read related operation, and an erase related operation for the plurality of memory cells.

2. The method of claim 1, wherein the synchronizing signal is an operation end pulse generated as the target operation is completed.

3. The method of claim 2, wherein, when the target operation is a program or erase operation, the operation end pulse is generated when a pass or a fail of the program or erase operation is determined.

4. The method of claim 2, wherein, when the target operation is a read operation, the operation end pulse is generated when fail of the read operation is determined or when data read in accordance with the read operation is stored.

5. The method of claim 1, wherein the detecting of the temperatures comprises:
   generating a temperature detection enable signal to control a temperature detect operation for the memory cells in response to the synchronizing signal; and
   detecting the temperatures of the memory cells in accordance with the temperature detection enable signal.

6. The method of claim 1, further comprising outputting the detected temperatures of the memory cells to the controller.

7. A semiconductor memory device comprising:
   a memory cell array including a plurality of memory cells;
   an operation control signal generator configured to receive a request for performing a target operation from a controller and to generate a synchronizing signal for performing the target operation; and
   a temperature detect circuit configured to detect temperatures of the plurality of memory cells in response to the synchronizing signal,
   wherein the target operation includes at least one of a program related operation, a read related operation, and an erase related operation for the plurality of memory cells.

8. The semiconductor memory device of claim 7, wherein the operation control signal generator generates an operation start pulse representing that the target operation starts and an operation end pulse representing that the target operation is completed.

9. The semiconductor memory device of claim 8, wherein the temperature detect circuit detects the temperatures of the plurality of memory cells in response to the operation end pulse.

10. The semiconductor memory device of claim 8, wherein, when the target operation is a program or erase operation, the operation control signal generator generates the operation start pulse in response to a write enable signal received from the controller.

11. The semiconductor memory device of claim 8, wherein, when the target operation is a program or erase operation, the operation control signal generator generates the operation end pulse when a pass or a fail of the program or erase operation is determined.

12. The semiconductor memory device of claim 8, wherein, when the target operation is a read operation, the operation control signal generator generates the operation end pulse when fail of the read operation is determined or data is read in accordance with the read operation.

13. The semiconductor memory device of claim 8, wherein the operation control signal generator transmits the operation end pulse to the temperature detect circuit as the synchronizing signal.

14. The semiconductor memory device of claim 7, wherein the target operation includes at least one of a program related operation, a read related operation, and an erase related operation for the plurality of memory cells.

15. The semiconductor memory device of claim 7, wherein the temperature detect circuit comprises:

an enable circuit configured to generate a temperature detection enable signal configured to control a temperature detect operation for the memory cells in response to the synchronizing signal; and a detect circuit configured to detect temperatures of the memory cells in accordance with the temperature detection enable signal.

16. The semiconductor memory device of claim 15, wherein the temperature detect circuit comprises an output circuit configured to output the detected temperatures of the memory cells to the controller.

17. The semiconductor memory device of claim 16, wherein the enable circuit comprises:

an inversion circuit configured to receive the synchronizing signal, invert the received synchronizing signal, and output an inverted synchronizing signal;

a selection output circuit configured to receive and perform a logic operation on the inverted synchronizing signal from the inversion circuit and an operation end pulse, and output a resultant signal; and a flip flop configured to receive the resultant signal and output the temperature detection enable signal.

18. The semiconductor memory device of claim 17, wherein the selection output circuit performs an OR operation on the inverted synchronizing signal from the inversion circuit and the operation end pulse.

\* \* \* \* \*